(12) United States Patent
Kassab et al.

(10) Patent No.: US 7,596,736 B2
(45) Date of Patent: Sep. 29, 2009

(54) ITERATIVE PROCESS FOR IDENTIFYING SYSTEMATICS IN DATA

(75) Inventors: Maroun Kassab, St-Eustache (CA); Leah M. Pfeifer Pastel, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 11/277,422

(22) Filed: Mar. 24, 2006

(65) Prior Publication Data

US 2007/0226566 A1    Sep. 27, 2007

(51) Int. Cl.
*G01R 31/28* (2006.01)
(52) U.S. Cl. .................................................. 714/732
(58) Field of Classification Search ................... 714/732
See application file for complete search history.

(56) References Cited

U.S. PATENT DOCUMENTS

| | | | |
|---|---|---|---|
| 5,497,381 A | 3/1996 | O'Donoghue et al. | |
| 5,513,188 A * | 4/1996 | Parker et al. | 714/727 |
| 5,638,381 A * | 6/1997 | Cho et al. | 714/732 |
| 5,977,558 A | 11/1999 | Lee | |
| 6,016,562 A * | 1/2000 | Miyazaki et al. | 714/724 |
| 6,701,477 B1 * | 3/2004 | Segal | 714/732 |
| 6,751,519 B1 | 6/2004 | Satya et al. | |
| 6,768,961 B2 | 7/2004 | Buckheit et al. | |
| 6,880,136 B2 | 4/2005 | Huisman et al. | |
| 2004/0064773 A1 | 4/2004 | Kundu et al. | |
| 2004/0228186 A1 | 11/2004 | Kadota | |

OTHER PUBLICATIONS

Huisman et al., "Statistical Diagnosis Using Fail Commonalities", pp. 1-9, Jan. 19, 2003.

* cited by examiner

*Primary Examiner*—James C Kerveros
(74) *Attorney, Agent, or Firm*—Michael LeStrange; Hoffman Warnick LLC

(57) ABSTRACT

An iterative process for identifying systematics in data is provided. In general, a set of data is processed based on a signature definition to create a set of signature data. The set of signature data is then analyzed to identify common signatures. The set of signature data is modified, using knowledge of the common signature(s), creating a revised set of signature data. The revised set of signature data is then analyzed again to identify new common signatures, if any. The modifying and analyzing steps are repeated until no new common signatures are identified. When no new common signatures are identified, the identified common signatures are reported.

20 Claims, 6 Drawing Sheets

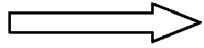

32 ↘

| Chip | Pin | Bit |
|---|---|---|
| chip A | pin 1 | bit 1 |
| chip B | pin 1 | bit 1 |
| chip A | pin 1 | bit 7 |
| chip B | pin 1 | bit 7 |
| chip B | pin 2 | bit 8 |
| chip C | pin 2 | bit 8 |
| chip D | pin 2 | bit 4 |
| chip D | pin 3 | bit 2 |
| chip E | pin 3 | bit 2 |

FIG. 12

⇩ pin 1 bit 1

32 ↘

| Chip | Pin | Bit |
|---|---|---|
| chip A | pin 1 | bit 7 |
| chip B | pin 1 | bit 7 |
| chip B | pin 2 | bit 8 |
| chip C | pin 2 | bit 8 |
| chip D | pin 2 | bit 4 |
| chip D | pin 3 | bit 2 |
| chip E | pin 3 | bit 2 |

FIG. 13

⇩ pin 1 bit 7

32 ↘

| Chip | Pin | Bit |
|---|---|---|
| chip B | pin 2 | bit 8 |
| chip C | pin 2 | bit 8 |
| chip D | pin 2 | bit 4 |
| chip D | pin 3 | bit 2 |
| chip E | pin 3 | bit 2 |

FIG. 14

⇩ pin 2 bit 8

32 ↘

| Chip | Pin | Bit |
|---|---|---|
| chip D | pin 2 | bit 4 |
| chip D | pin 3 | bit 2 |
| chip E | pin 3 | bit 2 |

FIG. 15

⇩ pin 3 bit 2

32 ↘

| Chip | Pin | Bit |
|---|---|---|
| chip D | pin 2 | bit 4 |

FIG. 16

ITERATIVE PROCESS FOR IDENTIFYING SYSTEMATICS IN DATA

BACKGROUND OF THE INVENTION

1. Field of the Invention

The present invention generally relates to data analysis. More particularly, the present invention provides an iterative process for identifying systematics in data.

2. Related Art

One part of the manufacturing process of integrated circuits (ICs), hereafter referred to as "chips," includes verifying that the chips are free of defects. One goal of this testing step is the identification of all defective chips. Another goal is collecting fail data for each defective chip, which can be used later, if so desired, to identify the defect that caused the fail. The combined fail data for a set of defective chips can be used in different ways to obtain information about the defects. For example, the effectiveness of the various steps in the test sequence in detecting defects can be determined, and fail probabilities can be calculated for various embedded objects (e.g., embedded random access memory).

Fail data can also be used as a signature of the underlying defect that caused the observed fail. Such signatures can be defined for each failing chip, using the raw fail data, or some type of summarization of the raw fail data. Fail signatures can be used to compare different chips, or the same chip under different test conditions, for commonalities, and these comparisons may then indicate if the fails were caused by the same defect mechanism.

Once a way is found to reliably compare different chips, the failing chips can be clustered into groups of chips that seem to have failed because of the same or similar defects. One reason for attempting such clustering is that, if all the chips in a single group did fail because of similar defects, information such as occurrence probabilities of such defects is available immediately. In addition, diagnosis can then be targeted to the more frequent defects.

Generally, chips are compared to each other in a pairwise manner and a measure of how correlated the chips are is determined. From this correlation, the chips are grouped into clusters of chips that are related based on their correlations to chips in the group. Unfortunately, the grouping of chips into clusters is problematic when there are multiple defects on a chip.

As an example of this problem, assume a plurality of chips that all fail bits on the same scan chain as follows:

Chip A fails bits 1 and 2;
Chip B fails bits 1 and 2;
Chip C fails bits 1, 2, and 4, and 7; and
Chip D fails bits 4 and 7.

Assuming that the correlation measure being used is number of bits in common/total number of bits, then chip C's correlation with chips A and B is less than chip A's correlation with chip B, because chip C also fails bits 4 and 7. This occurs even though chip C fails bits 1 and 2, just like chips A and B. Thus, whether chip C is clustered with chip A, B, or D, will depend on what correlation threshold is used when the clusters are generated.

As another example, assume a plurality of chips that all fail bits on the same scan chain as follows:

Chip A fails bits 1 and 2;
Chip B fails bits 1 and 2;
Chip C fails bits 1, 2, and 17-37; and
Chip D fails bits 17-37.

Assuming again that the correlation being used is number of bits in common/total number of bits, then Chips A, B are in cluster C0; and
Chips C, D are in cluster C1.

Chip C and chip D have a larger correlation than either chip C and chip A or chip C and chip B, because of the fail bits 17-37 on chip C; the correlation of chip C with chip A and the correlation of chip C with chip B are compromised. To this extent, chips that have multiple defects do not correlate as well as chips with the same single defect. The correlation algorithm and clustering algorithm determine how chips with multiple defects are clustered.

Many clustering algorithms only allow a chip to be placed in a single cluster. As such, in either of the above examples, chip C could either be grouped into a cluster containing chips A and B or into a cluster containing chip D, but not both, depending on the correlation algorithm and threshold that are used.

SUMMARY OF THE INVENTION

An iterative process for identifying systematics in data (e.g., in chip fail, parametric, or measurement data) is provided. In general, a set of data is processed (e.g., filtered) based on a signature definition to create a set of signature data. The set of signature data is then analyzed to identify common signatures. The set of signature data is modified, using knowledge of the common signature(s), creating a revised set of signature data. The revised set of signature data is then analyzed again to identify new common signatures, if any. The modifying and analyzing steps are repeated until no new common signatures are identified. When no new common signatures are identified, the identified common signatures are reported.

A first aspect of the present invention is directed to a method for identifying common signatures in data, comprising: analyzing a set of data to identify a common signature; modifying the set of data based on the common signature to provide a revised set of data; and analyzing the revised set of data to identify an additional common signature.

A second aspect of the present invention is directed to a system for identifying common signatures in data, comprising: means for analyzing a set of data to identify a common signature; means for modifying the set of data based on the common signature to provide a revised set of data; and means for analyzing the revised set of data to identify an additional common signature.

A third aspect of the present invention is directed to a program product stored on a computer readable medium for identifying common signatures in data, the computer readable medium comprising program code for performing the steps of: analyzing a set of data to identify a common signature; modifying the set of data based on the common signature to form a revised set of data; and analyzing the revised set of data to identify an additional common signature.

A fourth aspect of the present invention is directed to method for identifying common signatures in data, comprising: performing a clustering analysis on a set of data to identify a common signature; modifying the set of data by removing the common signature to form a revised set of data; and performing a clustering analysis on the revised set of data to identify an additional common signature.

The illustrative aspects of the present invention are designed to solve the problems herein described and other problems not discussed.

BRIEF DESCRIPTION OF THE DRAWINGS

These and other features of this invention will be more readily understood from the following detailed description of the various aspects of the invention taken in conjunction with the accompanying drawings in which:

FIG. 3 depicts illustrative signature data in accordance with an embodiment of the present invention.

FIGS. 4-10 depict the process of FIG. 2 applied to signature data of FIG. 3.

FIGS. 12-16 depict the process of FIG. 11 applied to signature data of FIG. 3.

Figure 1:
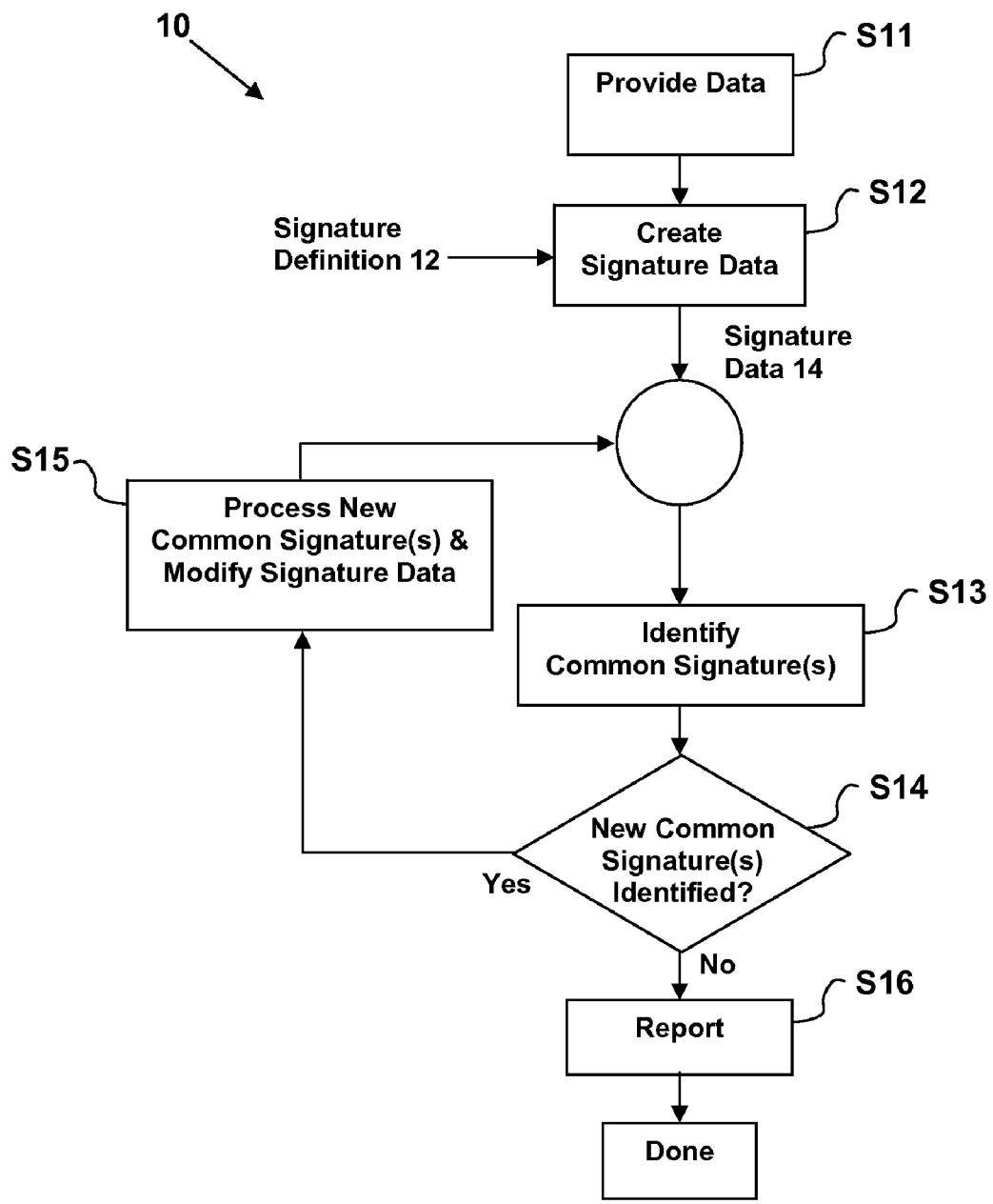
FIG. 1 depicts a general flow diagram of an illustrative process for identifying systematics in data in accordance with an embodiment of the present invention.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

As detailed above, an iterative process for identifying systematics in data (e.g., in chip fail, parametric, or measurement data) is provided. In general, a set of data is processed (e.g., filtered) based on a signature definition to create a set of signature data. The set of signature data is then analyzed to identify common signatures. The set of signature data is modified, using knowledge of the common signature(s), creating a revised set of signature data. The revised set of signature data is then analyzed again to identify new common signatures, if any. The modifying and analyzing steps are repeated until no new common signatures are identified. When no new common signatures are identified, the identified common signatures are reported. Other information such as cluster sizes, chips in each cluster, derived data and analysis (e.g., wafer maps), can also be reported.

A general flow diagram 10 of an illustrative process for identifying systematics in data in accordance with an embodiment of the present invention is depicted in FIG. 1. In step S11, a set of data to be analyzed for systematics is provided. Although the present invention can be used to determine the systematics within any type of data, the present invention will be described below in terms of chip fail data. The set of data to be analyzed for systematics can be provided in any suitable manner. In step S12, the set of data is analyzed based on a signature definition 12 to create a set of signature data 14. For example, the signature definition 12 could comprise the scan out pin of a scan chain and a bit in the scan chain that failed, resulting in signature data 14 such as "pin X bit Y." Many other types of signature definitions are also possible and the above example is not intended to be limiting in any way.

In step S13, common signatures within the set of signature data 14 are identified. This can be done using any suitable algorithm for determining commonalities within data. For example, a correlation or sorting analysis can be performed on the set of signature data 14 to identify common signatures. This analysis can include, for example, a clustering step in which failing chips with a particular common signature are clustered together. Other clustering methodologies can also be used.

If new common signature(s) are identified in step S14, then flow passes to step S15, where the new common signature(s) are processed and used to modify the set of signature data 14. If no new common signature(s) are identified in step S14, then flow passes to step S16. The set of signature data 14 can be modified, for example, by removing the new common signature(s) identified in step S14 from the set of signature data 14, thus providing a revised set of signature data 14. Flow then passes back to step S13. Steps S13-S15 are then repeated until no new common signature(s) are identified in step S14. In step S16, the identified common signatures, if any, are reported. Reporting can include, for example, listing each common signature or listing failing chips with a particular common signature.

Figure 2:
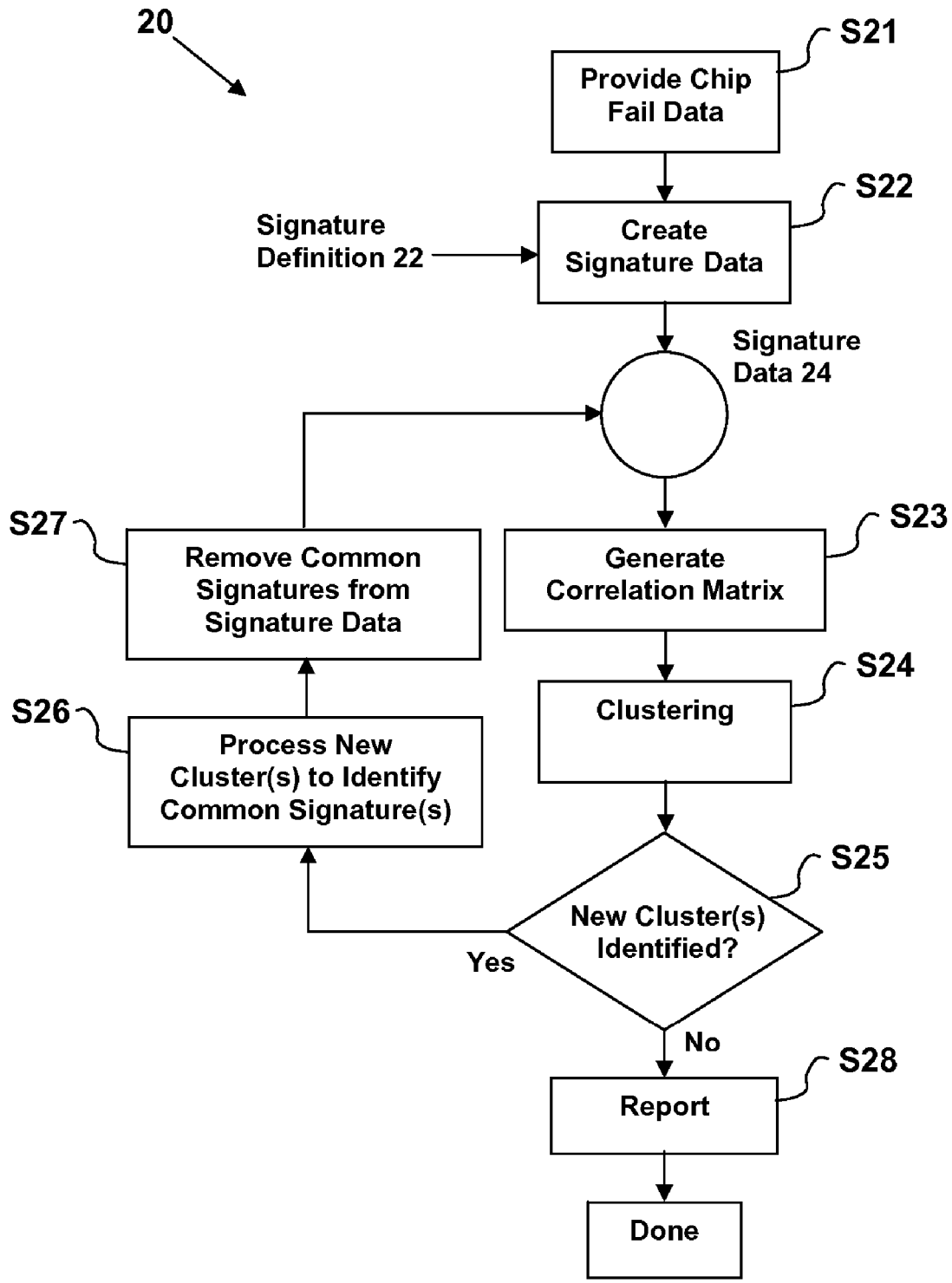
FIG. 2 depicts a flow diagram of an illustrative process for identifying systematics in chip fail data in accordance with an embodiment of the present invention.

Referring now to FIG. 2, there is depicted a flow diagram 20 of an illustrative process for identifying systematics in chip fail data in accordance with an embodiment of the present invention. In step S21, a set of chip fail data to be analyzed for systematics is provided, using any suitable methodology. In step S22, the set of chip fail data is analyzed based on a signature definition 22 to create a set of signature data 24. An example of a set of signature data 24 is depicted in FIG. 3. In this example, the signature definition 22 comprises, for a chip, the scan out pin of a scan chain and a bit in the scan chain that failed, resulting in signature data 24 for a "chip X" of "pin Y bit Z."

In steps S23 and S24, clusters within the set of signature data 24 are identified. In particular, in step S23, a correlation matrix is generated for the set of signature data 24. In FIG. 4, for example, there is depicted an illustrative correlation matrix 26 corresponding to the set of signature data 24 illustrated in FIG. 3. The correlation matrix 26 illustrates the correlation amongst the signature data 24. In step S24, clustering is performed on the correlation matrix 26 data to identify new cluster(s). The clustering can be performed using any suitable clustering algorithm.

If new cluster(s) are identified in step S25, then flow passes to step S26. If no new cluster(s) are identified in step S25, then flow passes to step S28. In step S26, each new cluster identified in step S25 is processed to identify the corresponding common signature in the set of signature data 24. In step S27, the common signature(s) identified in step S26 are removed from the set of signature data 24, thus providing a revised set of signature data 24. Flow then passes back to step S23. Steps S23-S27 are then repeated until no new cluster(s) are identified in step S25. In step S28, the identified common signatures, if any, are reported.

In an alternative embodiment of the present invention, the set of signature data 24 can be revised by adding/applying a label to each common signature identified in step S26. The label can be used to exclude previously identified common signatures when identifying new cluster(s) in the revised set of signature data 24. In this manner, previously identified common signatures are effectively "removed" from the set of signature data 24. Other techniques for "removing" identified common signatures from the set of signature data 24 are also possible.

Applying the above method to the set of signature data 24 illustrated in FIG. 3, and the corresponding correlation matrix 26 illustrated in FIG. 4, the following common signatures are identified and removed from the set of signature data 24:

pin 1 bit 1; and
pin 1 bit 7.

Removal of these common signatures results in the revised set of signature data 24 shown in FIG. 5. The correlation matrix 26 corresponding to the revised set of signature data 24 shown in FIG. 5 is depicted in FIG. 6.

The next iteration of the method results in the following common signature being removed from the revised set of signature data 24 shown in FIG. 5:

pin 2 bit 8.

This results in the revised set of signature data 24 shown in FIG. 7. The correlation matrix 26 corresponding to the revised set of signature data 24 shown in FIG. 7 is depicted in FIG. 8.

The next (and final iteration) of the method results in the following common signature being removed from the revised set of signature data 24 illustrated in FIG. 7:

pin 3 bit 2.

This results in the revised set of signature data 24 shown in FIG. 9. The correlation matrix 26 corresponding to the revised set of signature data 24 shown in FIG. 9 is depicted in FIG. 10. At this point, since there are no more new clusters in the revised set of signature data 24, the iterative process stops and the following identified common signatures in the original signature data 24 (FIG. 3) are reported:

pin 1 bit 1;
pin 1 bit 7;
pin 2 bit 8; and
pin 3 bit 2.

In general, the correlation strategy/parameters, clustering strategy/threshold/parameters, and/or other factors could influence the results provided by this and other embodiments of the present invention.

Figure 11:
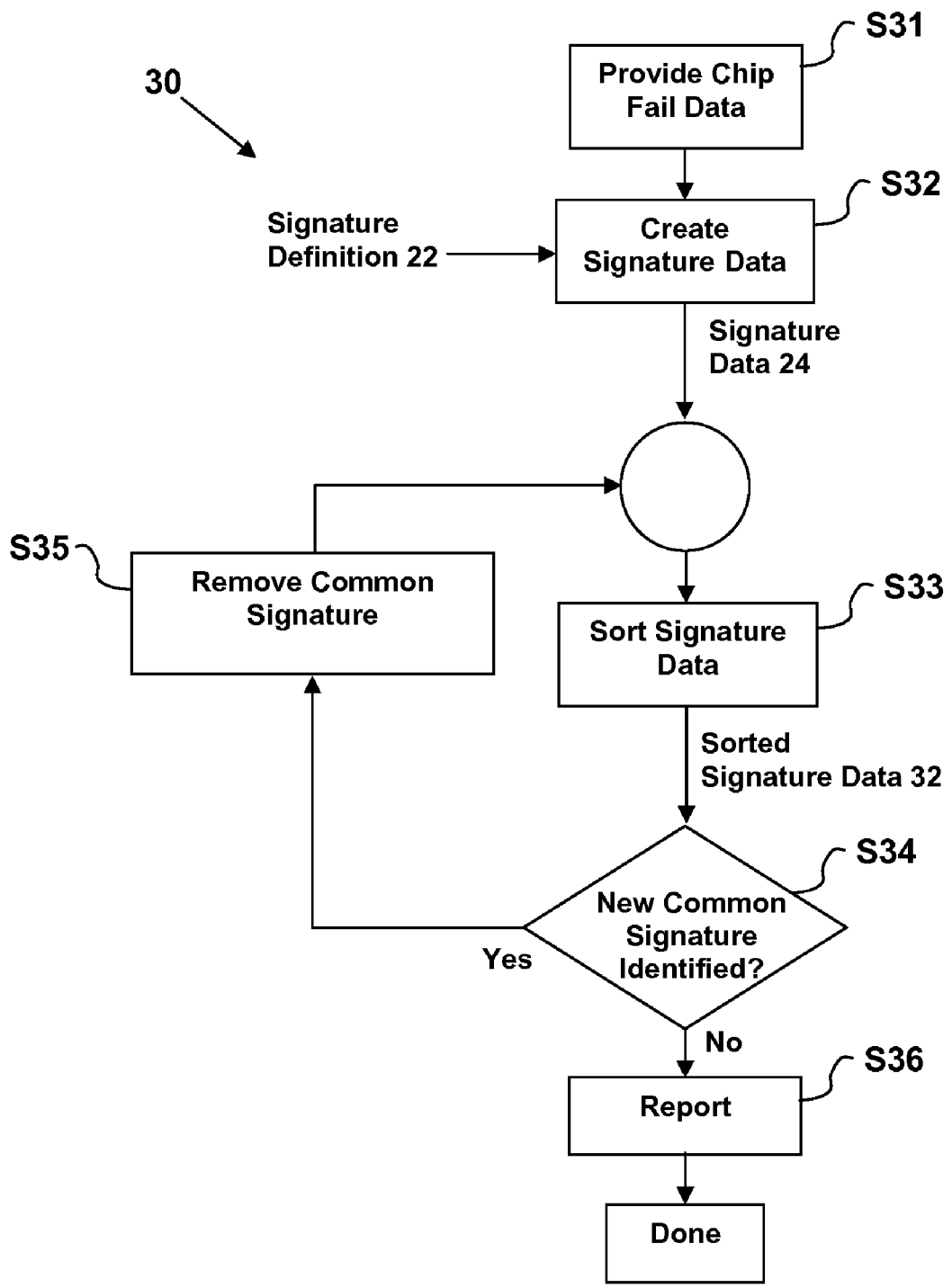
FIG. 11 depicts a flow diagram of an illustrative process for identifying systematics in chip fail data in accordance with another embodiment of the present invention.

Referring now to FIG. 11, there is depicted a flow diagram 30 of an illustrative process for identifying systematics in chip fail data in accordance with another embodiment of the present invention. In step S31, a set of chip fail data to be analyzed for systematics is provided, using any suitable methodology. In step S32, the set of chip fail data is analyzed based on a signature definition 22 to create a set of signature data 24. In this example, the invention will be described using the set of signature data 24 shown in FIG. 3.

In step S33, the set of signature data 24 is sorted by pin and bit, resulting in the set of sorted signature data 32 illustrated in FIG. 12. If a common signature is identified in step S34, then flow passes to step S35. If a common signature is not identified in step S34, then flow passes to step S36.

In step S35, the common signature identified in step S34 is removed from the set of sorted signature data 32, thus providing a revised set of sorted signature data 32. Flow then passes back to step S33. Steps S33-S35 are then repeated until all new common signatures have been identified in step S35. In step S36, the identified common signatures, if any, are reported.

Applying the above method to the sorted signature data 32 illustrated in FIG. 12, results in the identification and removal of the following common signature from the set of sorted signature data 32:

pin 1 bit 1.

Removal of this common signature results in the revised set of sorted signature data 32 shown in FIG. 13.

The next iteration of the method results in the following common signature being identified and removed from the revised set of sorted signature data 32 illustrated in FIG. 13:

pin 1 bit 7.

This results in the revised set of sorted signature data 32 shown in FIG. 14.

The next iteration of the method results in the following common signature being identified and removed from the revised set of sorted signature data 32 illustrated in FIG. 14:

pin 2 bit 8.

This results in the revised set of sorted signature data 32 shown in FIG. 15.

The next (and final iteration) of the method results in the following common signature being identified and removed from the revised set of sorted signature data 32 illustrated in FIG. 15:

pin 3 bit 2.

This results in the revised set of sorted signature data 32 shown in FIG. 16. At this point, since there are no new common signatures in the revised set of sorted signature data 32 illustrated in FIG. 16, the iterative process stops and the following common signatures in the original signature data 24 (FIG. 3) are reported:

pin 1 bit 1;
pin 1 bit 7;
pin 2 bit 8; and
pin 3 bit 2.

Figure 17:
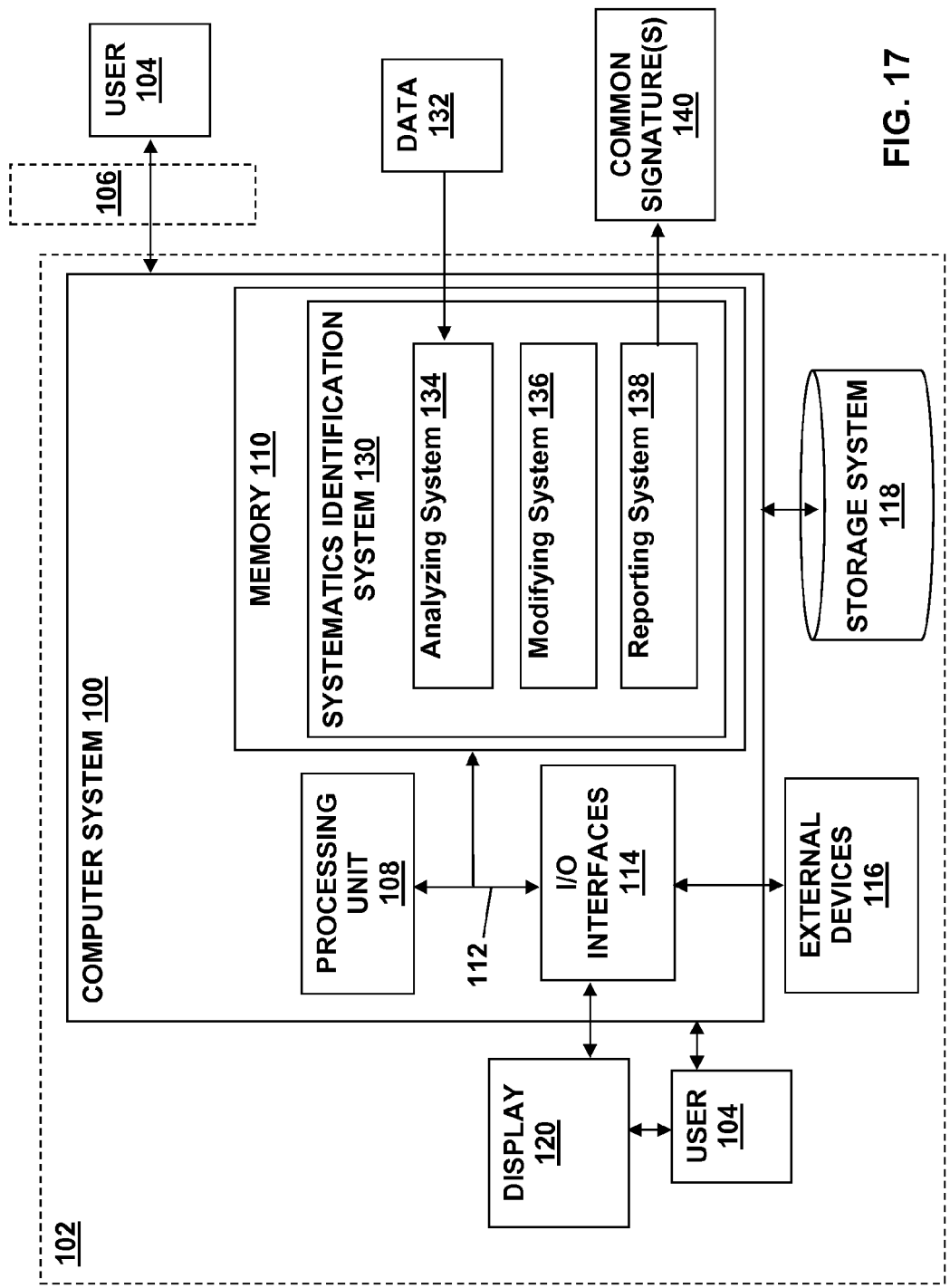
FIG. 17 depicts an illustrative computer system for implementing embodiment(s) of the present invention.

A computer system 100 for identifying systematics in data in accordance with an embodiment of the present invention is depicted in FIG. 17. Computer system 100 is provided in a computer infrastructure 102. Computer system 100 is intended to represent any type of computer system capable of carrying out the teachings of the present invention. For example, computer system 100 can be a laptop computer, a desktop computer, a workstation, a handheld device, a server, a cluster of computers, etc. In addition, as will be further described below, computer system 100 can be deployed and/or operated by a service provider that provides a service for identifying systematics in data in accordance with the present invention. It should be appreciated that a user 104 (e.g., a human or another computer) can access computer system 100 directly, or can operate a computer system that communicates with computer system 100 over a network 106 (e.g., the Internet, a wide area network (WAN), a local area network (LAN), a virtual private network (VPN), etc). In the case of the latter, communications between computer system 100 and a user-operated computer system can occur via any combination of various types of communications links. For example, the communication links can comprise addressable connections that can utilize any combination of wired and/or wireless transmission methods. Where communications occur via the Internet, connectivity can be provided by conventional TCP/IP sockets-based protocol, and an Internet service provider can be used to establish connectivity to the Internet.

Computer system 100 is shown including a processing unit 108, a memory 110, a bus 112, and input/output (I/O) interfaces 114. Further, computer system 100 is shown in communication with external devices/resources 116 and one or more storage systems 118. In general, processing unit 108 executes computer program code, such as systematics identification system 130 stored in memory 110 and/or storage system(s) 118. While executing computer program code, processing unit 108 can read and/or write data, to/from memory 110, storage system(s) 118, and/or I/O interfaces 114. Bus 112 provides a communication link between each of the components in computer system 100. External devices/resources 116 can comprise any devices (e.g., keyboard, pointing device, display (e.g., display 120, printer, etc.)) that enable a user to interact with computer system 100 and/or any devices (e.g., network card, modem, etc.) that enable computer system 100 to communicate with one or more other computing devices. External devices/resources 116 can also comprise a system for generating/providing the set(s) of data 132 to be analyzed by the systematics identification system 130 of the present invention.

Computer infrastructure 102 is only illustrative of various types of computer infrastructures that can be used to implement the present invention. For example, in one embodiment, computer infrastructure 102 can comprise two or more computing devices (e.g., a server cluster) that communicate over a network (e.g., network 106) to perform the various process steps of the invention. Moreover, computer system 100 is only representative of the many types of computer systems that can be used in the practice of the present invention, each of which can include numerous combinations of hardware/software. For example, processing unit 108 can comprise a single processing unit, or can be distributed across one or more processing units in one or more locations, e.g., on a client and server. Similarly, memory 110 and/or storage system(s) 118 can comprise any combination of various types of data storage and/or transmission media that reside at one or more physical locations. Further, I/O interfaces 114 can comprise any system for exchanging information with one or more external devices/resources 116. Still further, it is understood that one or more additional components (e.g., system software, communication systems, cache memory, etc.) not shown in FIG. 17 can be included in computer system 100. However, if computer system 100 comprises a handheld device or the like, it is understood that one or more external devices/resources 116 (e.g., a display) and/or one or more storage system(s) 118 can be contained within computer system 100, and not externally as shown.

Storage system(s) 118 can be any type of system (e.g., a database) capable of providing storage for information under the present invention. To this extent, storage system(s) 118 can include one or more storage devices, such as a magnetic disk drive or an optical disk drive. In another embodiment, storage system(s) 118 can include data distributed across, for example, a local area network (LAN), wide area network (WAN) or a storage area network (SAN) (not shown). Moreover, although not shown, computer systems operated by user 104 can contain computerized components similar to those described above with regard to computer system 100.

Shown in memory 110 (e.g., as a computer program product) is a systematics identification system 130 for identifying systematics in set(s) of data 132 in accordance with the present invention, as described above. In general, the systematics identification system 130 comprises an analyzing system 134 for analyzing a set of data 132 (or a revised set of data 132) to identify common signature(s) 140, a modifying system 136 for modifying the set of data 132 to form a revised set of data 132 (or for modifying a revised set of data 132 to provide a further modified set of data 132, etc.), and a reporting system 138 for reporting the identified common signature(s) 140. The systematics identification system 130 is configured to carry out an iterative process, such as that depicted in one or more of the flow diagrams 10, 20, and 30 illustrated in FIGS. 1, 2, and 11, respectively, in order to identify systematics in the set(s) of data 132.

The present invention can be offered as a business method on a subscription or fee basis. For example, one or more components of the present invention can be created, maintained, supported, and/or deployed by a service provider that offers the functions described herein for customers. That is, a service provider can be used to provide a service for identifying systematics in data, as described above.

It should also be understood that the present invention can be realized in hardware, software, a propagated signal, or any combination thereof. Any kind of computer/server system(s)—or other apparatus adapted for carrying out the methods described herein—is suitable. A typical combination of hardware and software can include a general purpose computer system with a computer program that, when loaded and executed, carries out the respective methods described herein. Alternatively, a specific use computer, containing specialized hardware for carrying out one or more of the functional tasks of the invention, can be utilized. The present invention can also be embedded in a computer program product or a propagated signal, which comprises all the respective features enabling the implementation of the methods described herein, and which—when loaded in a computer system—is able to carry out these methods.

The invention can take the form of an entirely hardware embodiment, an entirely software embodiment, or an embodiment containing both hardware and software elements. In a preferred embodiment, the invention is implemented in software, which includes but is not limited to firmware, resident software, microcode, etc.

The present invention can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device), or a propagation medium. Examples of a computer-readable medium include a semiconductor or solid state memory, magnetic tape, removable computer diskette, random access memory (RAM), read-only memory (ROM), rigid magnetic disk and optical disk. Current examples of optical disks include a compact disk-read only disk (CD-ROM), a compact disk—read/write disk (CD-R/W), and a digital versatile disk (DVD).

Computer program, propagated signal, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

The foregoing description of the preferred embodiments of this invention has been presented for purposes of illustration and description. It is not intended to be exhaustive or to limit the invention to the precise form disclosed, and obviously, many modifications and variations are possible.

What is claimed is:

1. A method performed on a computer for identifying common signatures in data, comprising:

analyzing a set of data to identify a common signature, the analyzing including generating a correlation matrix for the set of data and performing a clustering analysis on the correlation matrix, wherein the set of data comprises integrated circuit chip fail data, the integrated circuit chip fail data including information about a plurality of integrated circuit chips;

modifying the set of data based on the common signature to form a revised set of data, wherein the modifying comprises removing the data associated with the common signature from the set of data; and iteratively repeating the analyzing and modifying for the revised set of data to identify an additional common signature until no additional common signatures are identified.

2. The method of claim 1, wherein the step of analyzing the set of data to identify a common signature further comprises:
sorting the set of data.

3. The method of claim 1, wherein the step of modifying the revised set of data further comprises:
removing the additional common signature from the set of data.

4. The method of claim 1, further comprising:
reporting the identified common signature.

5. The method of claim 4, wherein the reporting includes one of listing the common signature or listing one of the plurality of integrated circuit chips associated with the common signature.

6. The method of claim 1, wherein the modifying includes applying a label to the identified common signature.

7. A computerized system for identifying common signatures in data, comprising:
means for analyzing a set of data to identify a common signature, the analyzing including generating a correlation matrix for the set of data and performing a clustering analysis on the correlation matrix, wherein the set of data comprises integrated circuit chip fail data, the integrated circuit chip fail data including information about a plurality of integrated circuit chips;
means for modifying the set of data by removing the data associated with the common signature from the set of data to provide a revised set of data; and
means for iteratively repeating the analyzing and modifying for the revised set of data to identify an additional common signature until no additional common signatures are identified.

8. The system of claim 7, wherein the means for analyzing the set of data to identify a common signature further comprises:
means for sorting the set of data.

9. The system of claim 7, wherein the means for modifying the revised set of data further comprises:
means for removing the additional common signature from the set of data.

10. The computerized system of claim 7, further comprising:
means for reporting the identified common signature.

11. The computerized system of claim 10, wherein the reporting includes one of listing the common signature or listing one of the plurality of integrated circuit chips associated with the common signature.

12. The computerized system of claim 7, wherein the modifying includes applying a label to the identified common signature.

13. A program product stored on a computer readable storage medium for identifying common signatures in data, the computer readable storage medium comprising program code for performing the steps of:
analyzing a set of data to identify a common signature, the analyzing including generating a correlation matrix for the set of data and performing a clustering analysis on the correlation matrix, wherein the set of data comprises integrated circuit chip fail data, the integrated circuit chip fail data including information about a plurality of integrated circuit chips;
modifying the set of data based on the common signature to form a revised set of data, wherein the modifying comprises removing the data associated with the common signature from the set of data; and
iteratively repeating the analyzing and modifying for the revised set of data to identify an additional common signature until no additional common signatures are identified.

14. The program product of claim 13, wherein the program code for performing the step of analyzing the set of data to identify a common signature further comprises program code for performing the step of:
sorting the set of data.

15. The program product of claim 13, wherein the program code for performing the step of modifying the revised set of data further comprises program code for performing the step of:
removing the additional common signature from the set of data.

16. The program product of claim 13, further comprising program code for performing the steps of:
reporting the identified common signature.

17. The program product of claim 16, wherein the reporting includes listing the common signature.

18. The program product of claim 17, wherein the reporting includes listing one of the plurality of integrated circuit chips associated with the common signature.

19. The program product of claim 13, wherein the modifying includes applying a label to the identified common signature.

20. A method performed on a computer for identifying common signatures in data, comprising:
generating a correlation matrix for a set of data;
performing a clustering analysis on the correlation matrix to identify a common signature, wherein the set of data comprises integrated circuit chip fail data, the chip fail data including information about a plurality of integrated circuit chips;
modifying the set of data based on the common signature by removing the data associated with the common signature to form a revised set of data; and
iteratively repeating the generating, performing of a clustering analysis, and modifying for the revised set of data to identify an additional common signature until no additional common signatures are identified.

* * * * *